United States Patent [19]

Cousins

[11] 4,355,095
[45] Oct. 19, 1982

[54] METHOD FOR PRODUCING A PHOTOMECHANICAL COLOR IMAGE USING A STRIPPABLE PHOTOSTENCIL AND WATER-PERMEABLE, WATER-INSOLUBLE COLOR MEDIA

[76] Inventor: William W. Cousins, 26 Norwich Dr., Apt. G, Rochester, N.Y. 14624

[21] Appl. No.: 210,748

[22] Filed: Nov. 26, 1980

[51] Int. Cl.³ ............................................. G03C 5/04
[52] U.S. Cl. .................................. 430/293; 430/294; 430/304; 430/308; 430/329
[58] Field of Search ............... 430/304, 308, 293, 294, 430/329

[56] References Cited

U.S. PATENT DOCUMENTS

| | | | |
|---|---|---|---|
| 1,861,872 | 6/1932 | Murray | 430/293 |
| 2,236,417 | 3/1941 | Spainhour | 430/293 |
| 2,577,984 | 12/1951 | Warnecke | 430/22 |
| 2,787,543 | 4/1957 | Murray et al. | 430/293 |
| 2,831,765 | 4/1958 | Kleinschmidt | 430/347 |
| 2,908,667 | 10/1959 | Williams | 430/294 |
| 3,238,042 | 3/1966 | Uhlig | 430/304 |
| 3,258,337 | 6/1966 | Cousins | 430/293 |
| 3,323,917 | 6/1967 | Straw et al. | 430/294 |
| 3,406,065 | 10/1968 | Uhlig | 430/304 |
| 3,558,310 | 1/1971 | Mayaud | |
| 3,712,814 | 1/1973 | Ranz et al. | 430/253 |
| 3,779,759 | 12/1973 | Lawson et al. | 430/304 |
| 3,841,891 | 10/1974 | Pallant | 430/293 |
| 4,049,452 | 9/1977 | Nekut | 430/329 |
| 4,053,313 | 10/1977 | Fan | 430/270 |

Primary Examiner—J. Travis Brown
Attorney, Agent, or Firm—Finnegan, Henderson, Farabow, Garrett & Dunner

[57] ABSTRACT

Method of forming a color image of a graphic object pattern directly on a support medium. A water-soluble photosensitive stencil material is coated on the support and exposed imagewise to actinic radiation. The exposed photosensitive stencil material is developed to remove the water-soluble, unexposed stencil material. A layer of water-permeable, water-insoluble color medium is applied. The color medium is treated with water or an aqueous solution to permeate the color medium and soften the stencil material which is removed by mechanical action. Alternatively, a water-insoluble photosensitive stencil material, which becomes water-soluble on exposure to actinic radiation, may be coated on the support.

31 Claims, 32 Drawing Figures

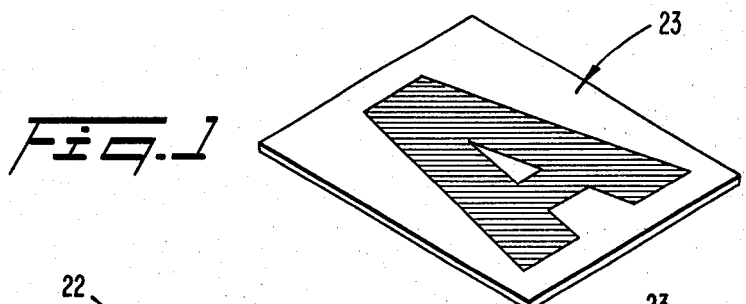
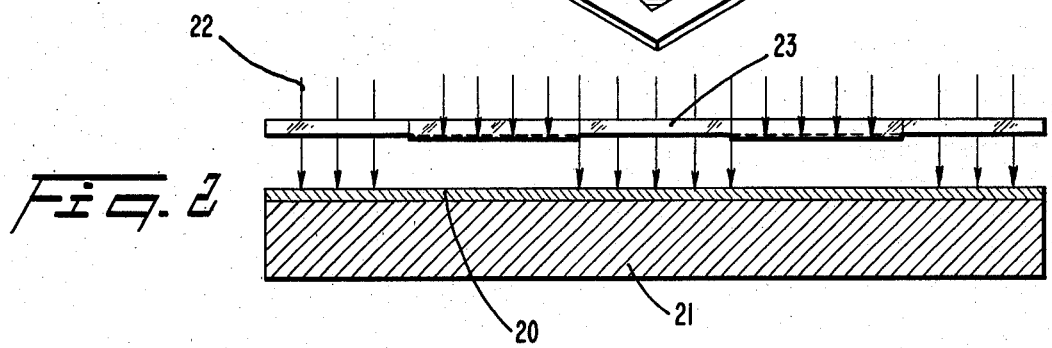
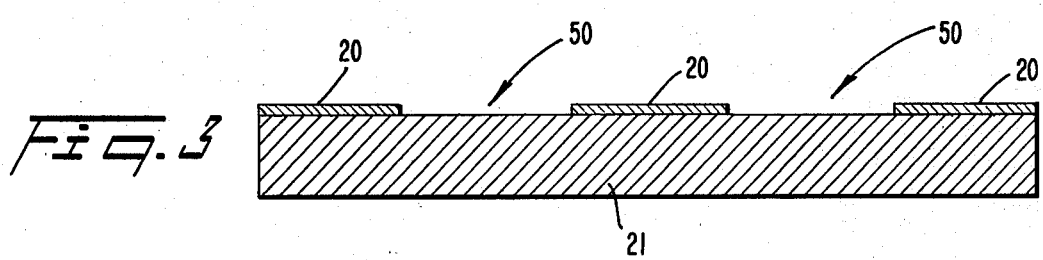
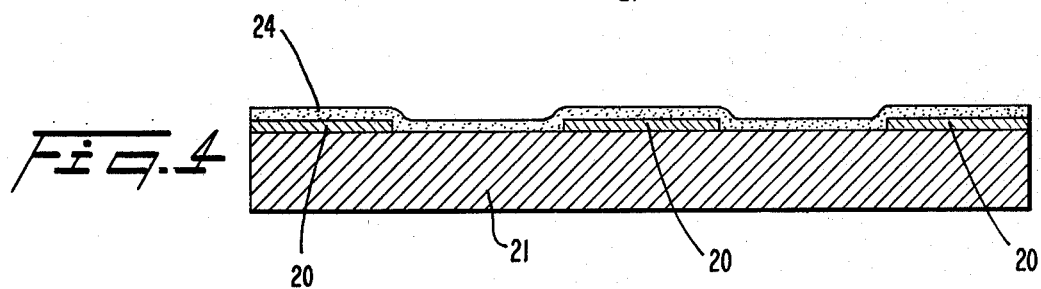
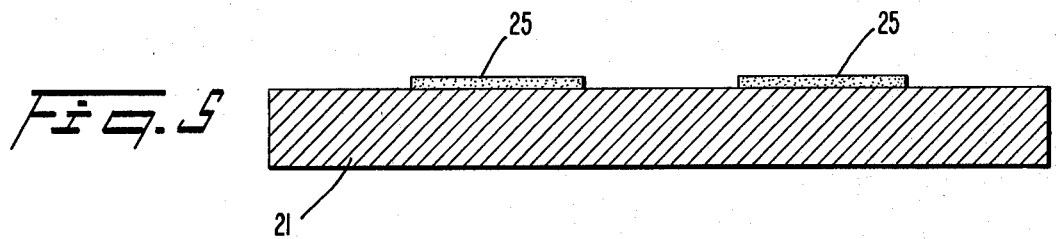
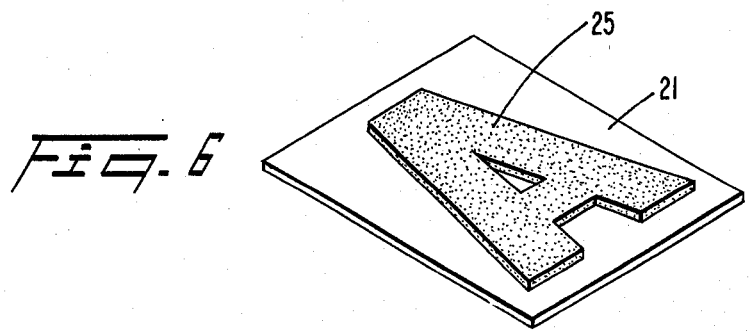

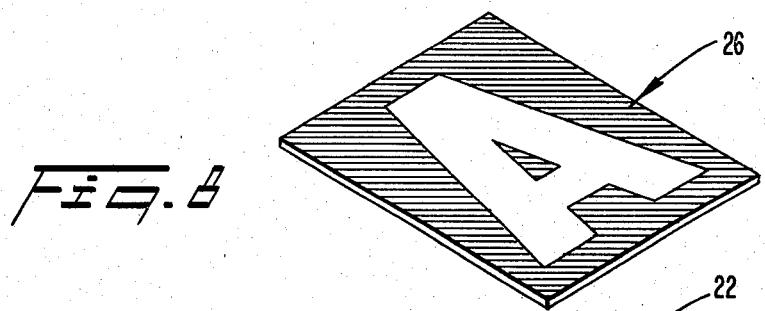
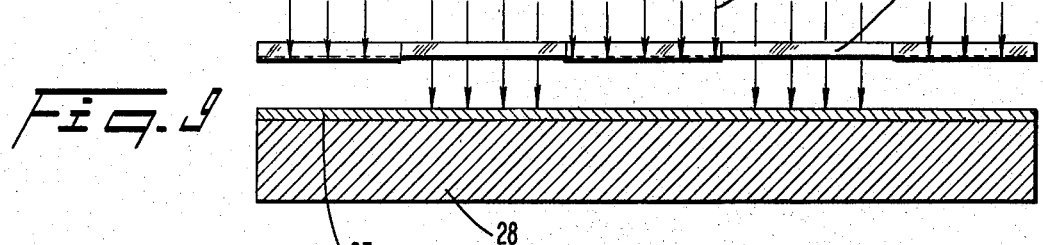
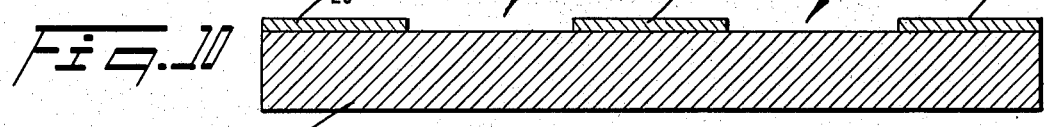
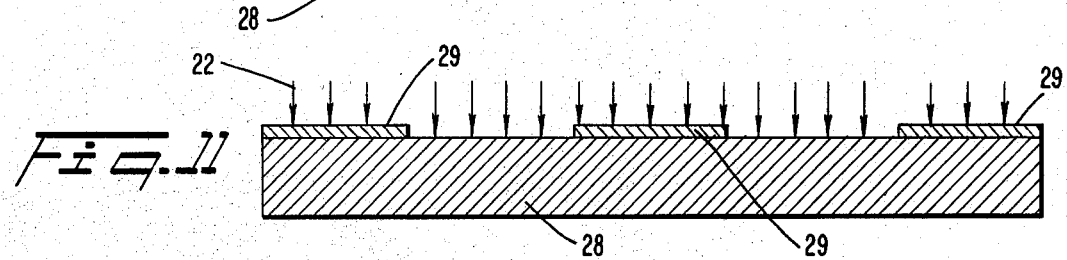
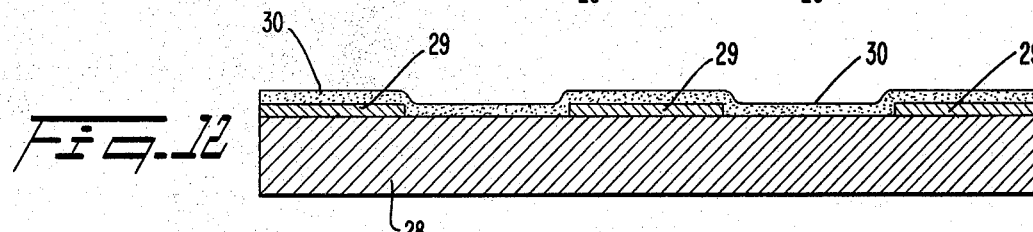
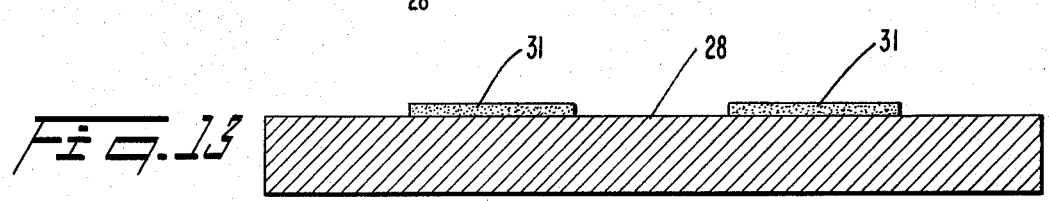
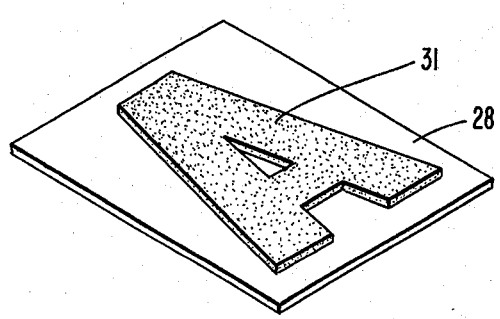

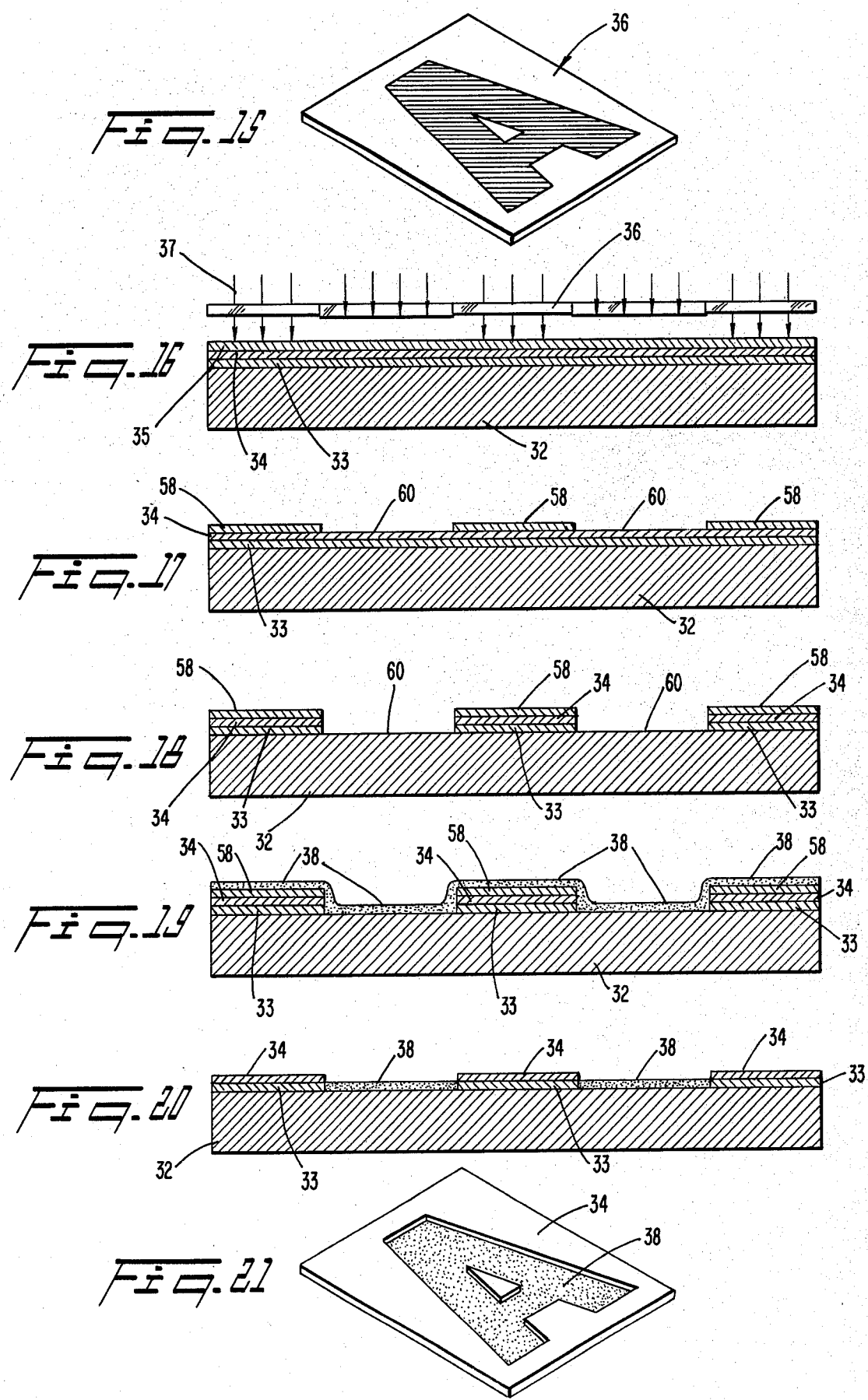

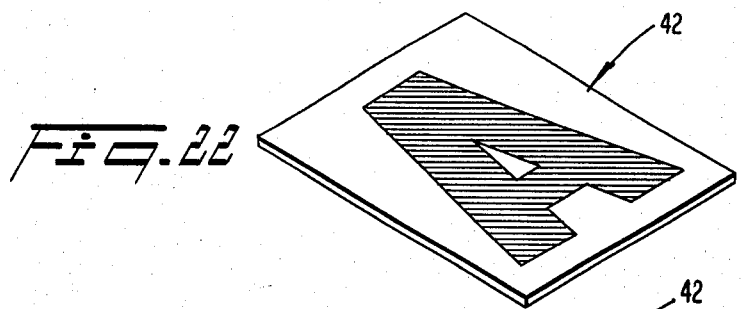
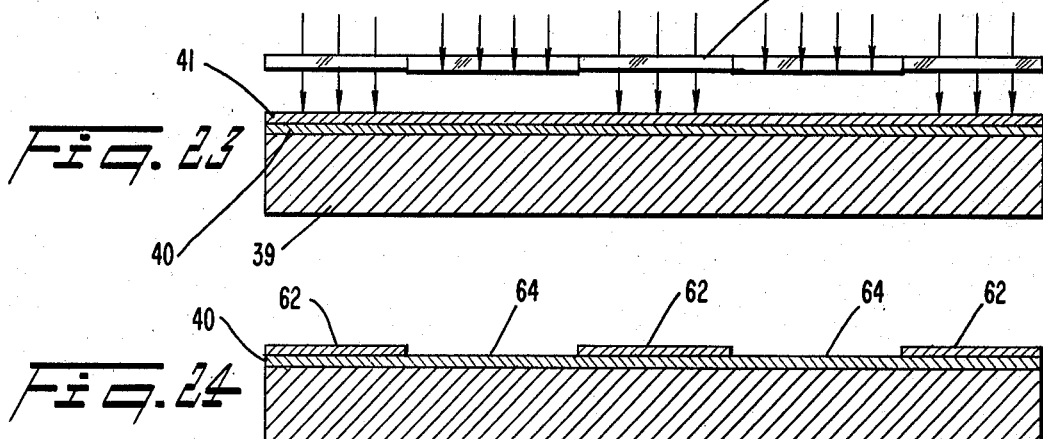
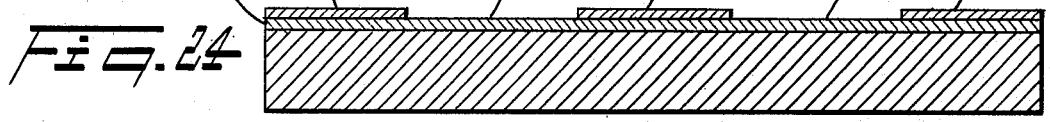
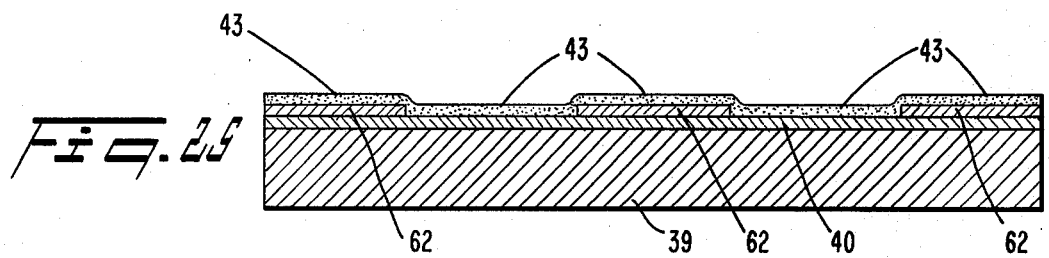
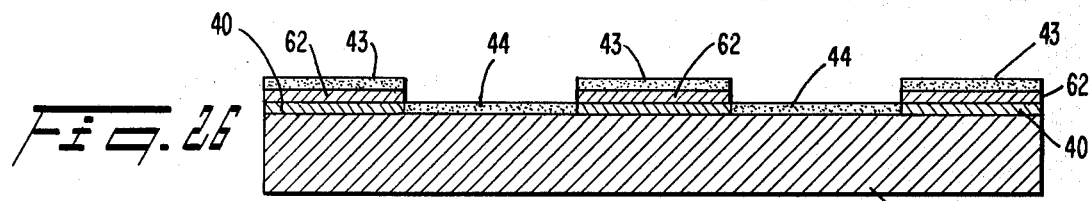
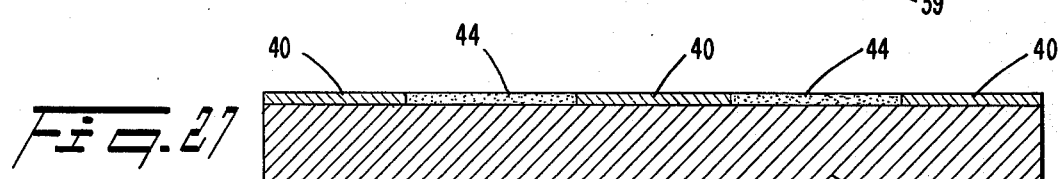
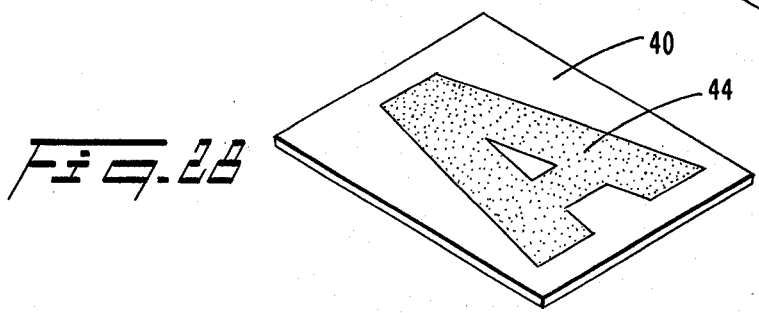

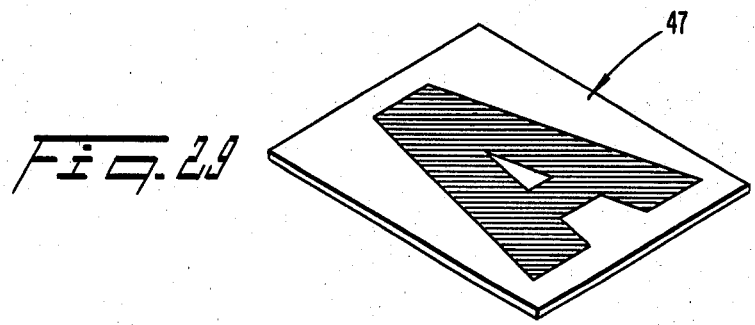
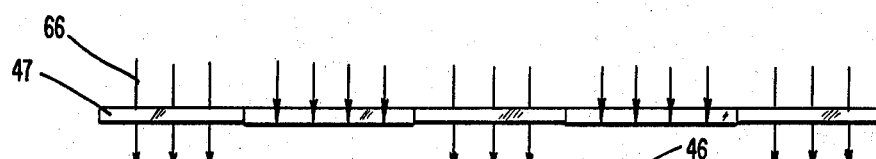
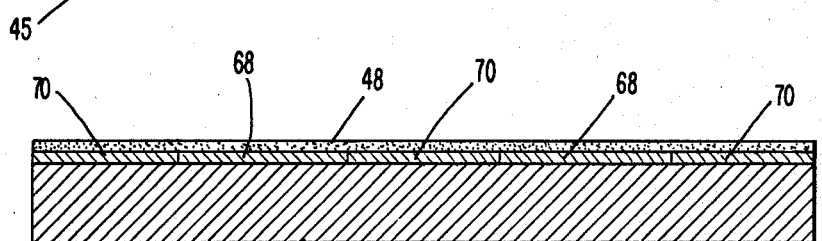
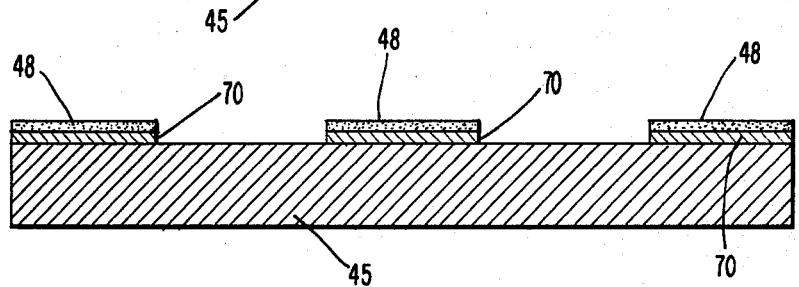
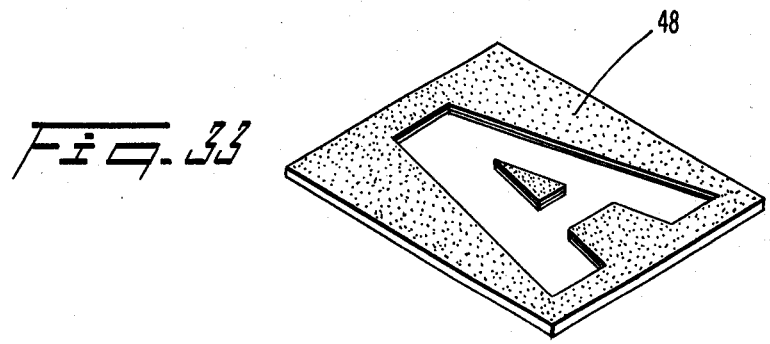

METHOD FOR PRODUCING A PHOTOMECHANICAL COLOR IMAGE USING A STRIPPABLE PHOTOSTENCIL AND WATER-PERMEABLE, WATER-INSOLUBLE COLOR MEDIA

BACKGROUND OF THE INVENTION

The present invention relates to photomechanical imaging processes. More particularly, this invention relates to color imaging processes utilizing both a removable photostencil produced directly or indirectly on a support and a water-permeable, water-insoluble color medium.

The art describes photomechanical imaging processes utilizing photosensitive materials. For example, such materials can be used as photoresists in metal etching processes or color imaging processes such as that described in U.S. Pat. No. 3,258,337, wherein a transparent photoresist image is produced on a layer of ink on a support. The ink is redissolved and removed in those areas not protected by the transparent image, thus forming a colored ink image underlying a transparent resist image. Other processes add colorant to the photosensitive material, or in the case of the screen printing process, use a photosensitive material to produce a photostencil on a screen printing frame from which color images are produced.

The art, however, has sought a method for producing an original color copy, wherein the color copy also serves as a high quality color proof. Further, in the field of color reproduction, the cost of producing large sizes and limited quantities by a printing process, wherein images are produced by a transfer method from plate to stock, is often prohibitive. Thus a color image production process is desired for the direct formation of color images on a support by means of a mechanized, plateless system.

The art would also appreciate a process for producing multiple copies more economically than either an artist is able to do by hand or can be accomplished by a printing process.

The art has sought, moreover, photochemical imaging processes wherein the only solvents needed for developing and stripping steps are water or aqueous solutions.

Further, a method is desired in which multicolored images may be processed at one time with one exposure through a photomask on which the originals of these images are represented, providing none of the images are touching or overlapping. Such a method for handling multicolored designs would result in a reduction of processing time.

Additionally, a method is desired for producing one or more colored images on a colored background, in which the images are (1) in automatic register with the background image; and (2) produced using a single graphic object pattern or photomask with a single exposure and a single processing.

In photomechanical imaging processes, moreover, more accurate image resolution has been sought.

Further, the art has sought a method for producing by photomechanical means color proofs, including four-color process proofs, on a single support surface, with image resolution equaling that of fine printing.

The art has also sought an improved method for producing opaque images on such supports as transparent plastic films, aluminum foil and the like, for which the hiding power of opaque pigments such as titanium dioxide is required.

In accordance with the present invention, a method relating to photomechanical imaging processes has been discovered for producing an original color copy, wherein the color copy also serves as a high quality color proof. The present invention also provides for the direct formation of color images on a support by means of a mechanized, plateless system and thus reduces the cost of producing a large sized color image and limited quantities of color images.

Further, in certain embodiments of the present invention, only water or aqueous solvents are needed in the developing and stripping steps. The use of flammable organic solvents is thus avoided.

In the method of the present invention, moreover, multicolored images may be processed at one time with one exposure through a photomask on which the originals of these images are represented, providing none of the images are touching or overlapping.

The present invention also allows for producing one or more colored images on a colored background, wherein the images are in automatic register with the background image and are produced using a single photomask and a single exposure in a single processing.

Moreover, the present invention achieves more accurate image resolution and provides for producing color proofs, including four-colored process proofs on a single support surface, with image resolution equaling that of fine printing.

The present invention also provides a method for producing opaque images on such supports as transparent plastic films, aluminum foil and the like, for which the hiding power of opaque pigments such as titanium dioxide is required.

The present invention further provides for the multicolored reproduction of one or more graphic object patterns on a support medium.

SUMMARY OF THE INVENTION

The present invention relates to a method for forming a color reproduction of a graphic object pattern comprising the steps of (a) forming a coating layer of a water-soluble photosensitive stencil material on at least a portion of the support medium, the water-soluble photosensitive material being rendered water-insoluble by actinic radiation; (b) exposing the coating layer to actinic radiation imagewise of a graphic object pattern to thereby photographically produce an imagewise pattern of water-insoluble and water-soluble stencil material regions on the support medium; (c) developing the imagewise pattern with water or an aqueous solution to remove the water-soluble stencil material regions of the imagewise pattern to thereby form a stencil image of the object pattern on the support medium, the image being of water-insoluble stencil material and defining areas having no stencil material on the support medium; (d) overcoating with a layer of water-permeable, water-insoluble color medium of a desired image color at least a portion of the water-insoluble stencil material image and of the defined areas having no stencil material; (e) treating at least the overcoated portion of the water-insoluble stencil material with water or an aqueous solution to permeate the color medium and soften the water-insoluble stencil material; and (f) removing by mechanical action the softened water-insoluble stencil material along with the color medium layer overlying it, while leaving the color medium layer intact on the defined areas, whereby a color reproduction of the graphic object pattern is formed on the support medium.

The present invention further relates to a method for forming a color reproduction of a graphic object pattern comprising the steps of (a) forming a coating layer of a water-insoluble photosensitive stencil material on at least a portion of a support medium, the water-insoluble photosensitive stencil material being rendered water-soluble by actinic radiation; (b) exposing the coating layer to actinic radiation imagewise of a graphic object pattern to thereby photographically produce an imagewise pattern of water-insoluble and water-soluble stencil material regions on the support medium; (c) developing the imagewise pattern with water or an aqueous solution to remove the water-soluble stencil material regions of the imagewise pattern to thereby form a stencil image of the object pattern on the support medium, the image being of water-insoluble stencil material and defining areas having no stencil material on the support medium; (d) exposing the remaining water-insoluble stencil material to sufficient light to render the remaining stencil material soluble in water or an aqueous solution; (e) overcoating with a layer of water-permeable, water-insoluble color medium of a desired image color at least a portion of the now water-soluble stencil material image and of the defined areas having no stencil material; and (f) treating at least the overcoated portion of the now water-soluble stencil material with water or an aqueous solution to permeate the color medium and remove the water-soluble stencil material and the overlying color medium layer, while leaving the color medium layer intact as a color image in the defined areas.

This invention may also be utilized to produce multicolored reproductions from one graphic object pattern or to use additional graphic object patterns and additional color media to obtain a multicolored reproduction.

The invention also relates to a method of forming a multicolored reproduction of a graphic object pattern comprising the steps of (a) forming a first coating layer of a lacquer on at least a portion of a support medium; (b) forming a second coating layer of an organically-soluble color medium on the first coating layer; (c) applying a substance to the second coating layer to give the second coating layer a water-receptive surface; (d) forming a third coating layer of a water-soluble photosensitive stencil material on the second coating layer; (e) exposing the third coating layer to actinic light imagewise of a graphic object pattern to thereby photographically produce an imagewise pattern of water-insoluble and water-soluble stencil material regions on the second coating layer; (f) developing the imagewise pattern with water or an aqueous solution to remove the water-soluble stencil material in the third coating layer to thereby form a stencil image of the object pattern on the second coating layer; the image being of water-insoluble stencil material and defining areas having no stencil material on the second coating layer; (g) removing with an organic solvent the first and second coating layers in the defined areas to expose the support medium in the areas; (h) forming the defined areas of the support medium and on the image produced in step (f) a fourth coating layer of a water-permeable, water-insoluble color medium differing in color from that applied in step (b); (i) treating the fourth coating layer of color medium with water or an aqueous solution which permeates the color medium and softens the water-insoluble stencil material; and (j) removing by mechanical action the softened water-insoluble stencil material along with the color medium layer overlying it, while leaving intact the fourth coating layer of color medium on the defined areas of the support medium and while leaving intact the second coating layer of color medium underlying the image; whereby a two color reproduction is produced on the support medium.

The invention also relates to a method for producing an opaque image on a support medium requiring the hiding power of an opaque pigment comprising the steps of:

(a) forming a first coating layer of water-soluble photosensitive stencil material containing on opaque metal oxide pigment catalyst and an organic dye promoter on at least a portion of such a support medium;

(b) exposing the first coating layer to actinic radiation imagewise of a graphic object pattern to thereby photographically produce an imagewise pattern of water-insoluble and water-soluble stencil material regions on the support medium;

(c) forming a second coating layer of a water-permeable, water-insoluble dye solution on the first coating layer;

(d) drying the second coating layer;

(e) treating the second coating layer with water or an aqueous solution to permeate the second layer and remove the underlying water-soluble stencil material regions and the overlying second layer, while leaving the second coating layer intact over the underlying water-insoluble stencil material regions.

The accompanying drawings, which are incorporated herein and constitute a part of the specification, illustrate different embodiments of the invention and, together with the description, serve to explain the principles of the invention.

BRIEF DESCRIPTION OF THE DRAWINGS

FIGS. 1, 6, 8, 14, 15, 21, 23, 28, 29 and 33 represent isometric views of graphic object patterns and color images produced from the graphic object patterns.

FIGS. 2-5 represent diagrammatic cross-sectional views of a process for forming a positive color image utilizing a positive-working photostencil material and a positive graphic object pattern or photomask.

FIGS. 9-13 represent diagrammatic cross-sectional views of a process for forming a positive color image utilizing a negative-working photostencil material and a negative graphic object pattern or photomask.

FIGS. 16-20 represent diagrammatic cross-sectional views of a process for producing a two color design in which the colored copy appears on a background of a different color.

FIGS. 23-27 represent diagrammatic cross-sectional views of a process for producing a color image on a support by means of a dye solution which does not contain a binder resin.

FIGS. 30-32 represent diagrammatic cross-sectional views of a process for producing an opaque image on a support such as transparent plastic films or aluminum foil for which the hiding power of opaque pigments such as titanium dioxide is required.

The thicknesses of photostencil, color medium, and lacquer layers are greatly exaggerated in these drawings for the sake of illustration. In reality, the photostencil, color medium and lacquer layers are of negligible or imperceptible thickness in relation to the thicknesses of the support media and the graphic object patterns.

There is no FIG. 7 in the application.

DETAILED DESCRIPTION OF THE PREFERRED EMBODIMENTS

Reference will now be made in detail to the presently preferred embodiments of the invention, examples of which are illustrated in the accompanying drawings.

For the sake of clarity, it is desirable to make a distinction between the definition of a "photostencil", as defined herein, and a "photoresist," as commonly defined. A "photoresist" as used in the manufacture of a letterpress printing plate is defined as a photosensitive coating material which, when coated on an etchable support, exposed imagewise through a photomask to actinic light and treated in a development step, retains an imagewise protective layer on the support representing the exposed areas. This imagewise protective layer is resistant to the dissolving action of an etchant. The photoresist coated areas thus become the images or printing areas when the printing plate thus produced is inked and the ink transferred to the support.

In the present invention, however, the photosensitive coating material will be designated as "photostencil" and defined as a photosensitive coating material which, when coated on at least a portion of a support medium, exposed imagewise through a graphic object pattern (photomask) to actinic light and treated in a development step with water or an aqueous solution, produces (1) an image on the support representing either the exposed or the masked areas, depending on the type of photostencil material used, as explained hereafter, and (2) areas having no photostencil material which are defined by the image. A color medium is subsequently applied to the image and the defined areas. A stripping procedure thereafter removes the photostencil image along with the overlying color layer. The color image remains on the support as a monolayer in those defined areas not protected by the photostencil material after the development step.

There are at least two basic types of photosensitive materials useful as photostencils in the present invention. Type A is a water-soluble material which reacts to light, particularly actinic light, by becoming insoluble to water in the exposed areas.

Type A materials, as used in photoetching processes, for example, are described as negative-working photoresists, i.e., a negative photomask is required to form a positive image. Type A materials as used in the present process, however, are described as positive-working photostencils, i.e., a positive photomask is required to form a positive image.

Type B photosensitive material is water-insoluble but reacts to actinic light by becoming soluble to water or aqueous solutions in the exposed areas. Type B materials as used in photoetching processes, for example, are described as positive-working photoresists, i.e, a positive photomask is required to form a positive image.

Type B materials as used in the present process, however, are described as negative-working photostencils, i.e., a negative photomask is required to form a positive color image.

FIG. 1 shows a graphic object pattern or photomask 23 which includes a clear area defining an opaque emulsion surface or mask represented by the character A. Although the graphic object pattern 23 is representative of any intermediate of which reproduction is desired, a graphic object pattern typically consists of a plastic sheet with a photographic emulsion on one face.

In FIG. 2, a coating layer of water-soluble photosensitive stencil material of type A 20 is formed on at least a portion of a support medium 21. The support medium 21 may be any suitable sheet of paper, card, plastic, metal or the like which will support the photosensitive stencil material 20 and the final image-defining color medium 25.

Preferred materials for the type A water-soluble photosensitive stencil material 20 includes well-known photohardenable materials with ethylenically unsaturated groups in the molecule. The molecular weight of these materials is increased by exposure to actinic radiation. Also useful are the various combinations of an organic colloid or synthetic resin with a diazonium compound that are described in Kosar, Light Sensitive Systems, Chapter 7 (Wiley, 1965).

An unmodified Type A photoresist insolubilized by actinic light may also be suitable for use as photosensitive stencil material if the length of exposure to actinic radiation is reduced so that the exposed areas, although rendered insoluble, are not so insoluble that they cannot subsequently be removed.

To achieve easily removable photostencils, however, type A photoresist formulas can be modified by adding radiation-insensitive materials such as methyl cellulose, polyamides, or polyvinylpyrrolidones. These compounds reduce the resistance to removal during the stripping step of the photosensitive stencil material exposed to the actinic radiation. Further, casein-dichromate Type A photoresist, in which ammonium carbonate is used in place of ammonium hydroxide to provide the necessary alkalinity to dissolve the casein, is desirable because the exposed regions of this material puff up in the stripping solution, thus facilitating removal of the photostencil.

Aqueous pigment dispersions are also desirable additives to either Type A photosensitive stencil material or to Type A photoresist materials. The pigments provide a visual aid for inspecting the stencil after the water or aqueous solution development step and also aid penetration of the photosensitive stencil material layer by the water or aqueous solution during the stripping step. Another desirable additive is at least one dyestuff selected from the group consisting of amino fluorines, hydroxy fluorines and hydroxy fluorones.

Surfactants such as the alkyl sulfates or the polar ethoxylated alkyl phenols are also advantageous as additives to the photosensitive stencil material because they assist in achieving rapid water penetration and evenness of flow when the material is applied as a coating.

As further shown in FIG. 2, graphic object pattern 23 is laid emulsion side down on the stencil coating layer 20. The stencil layer 20 on the support 21 is exposed imagewise to actinic rays 22 passing through the transparent areas of graphic object pattern 23 to photographically produce an imagewise pattern of water-insoluble and water soluble regions on the support medium 21.

FIG. 3 represents the step of developing the exposed stencil material by washing out the unexposed and thus still water-soluble regions of the stencil material with water or an aqueous solution and leaving the exposed, water-insoluble material regions 20 on the support medium 21. The regions 20 form a stencil image which also defines areas 50 on the support medium 21 having no stencil material.

As used above, the term "washing out" is defined to include the removal of photostencil material by using either plain water or an aqueous solution and may further include spraying and mechanical action such as brushing or swabbing with a cotton pad. Preferably, the aqueous solutions contain a surfactant and an excess of hydroxyl ions.

FIG. 4 represents the step of overcoating with a layer 24 of water-permeable, water-insoluble color medium of a desired image color at least a portion of the water-insoluble stencil material image 20 and of the defined areas 50 having no stencil material.

The water-permeable water-insoluble color medium may include inks, paints, emulsions, dispersions, or dyestuff solutions, as long as the color medium possesses the basic requirement of being water-insoluble and water-permeable.

The simplest color medium applicable to the present invention is an organic dye dissolved in a organic solvent, without a resin binder. An aqueous stripping solution would penetrate such a coating quickly. Such dye solutions are preferably used on supports 21 with adsorbent surfaces.

The addition of a resin binder, however, is necessary to provide gloss and improved adhesion to a color medium. Preferably, therefore, the color medium is a solvent type cellulosic printing ink or an ink containing a pigment colorant and a polar resin dissolved in a solvent selected from the group consisting of polar solvents, hydrogen-bonded solvents and mixtures thereof. Preferably the resin is a cellulose ester resin binder with hydrophilic groups, such as free hydroxyl groups in the cellulose chain.

Preferred solvents or mixtures of solvents include alcohols, esters and glycol esters. Preferably standard printing ink pigments including inorganic, organic dye lake and fluorescent pigments are used. The color medium may also contain a water soluble surfactant such as one chosen from the ethoxylated alkyl phenol series.

An unmodified, standard alcohol-soluble nitrocellulose flexographic printing ink constitutes a satisfactory color medium for the process of the present invention. Further, emulsion paints, both water-in-oil and oil-in-water types, can be formulated having properties of water-insolubility and water-permeability. A preferred emulsion paint contains at least a dye, a metal oxide pigment and a polymer dispersed in water.

FIG. 5 represents the step of removing or stripping the softened water-insoluble stencil material along with the color medium layer overlying it, while leaving the color medium layer 25 intact as a color image on the defined areas 50 of the support medium 21. Water or an aqueous solution, as defined above, permeates the color medium layer 24 overlying the water-insoluble stencil material and softens it. The softened stencil material 20, along with the color medium layer 24 overlying the stencil, is subsequently removed by mechanical action.

FIG. 6 shows an isometric view of the color image 25 reproduced from the film positive graphic object pattern of FIG. 1.

To produce a multi-colored reproduction of the graphic object pattern 23 on the support medium 21, wherein none of the color images are touching or overlapping, one can repeat at least once the step of overcoating with a layer 24 of a water-permeable, water-insoluble color medium of a different image color on another portion of the water-insoluble material 20 and of the defined areas 50, followed by stripping, as explained above.

For some applications, it may be desirable to coat a transparent material over the support medium prior to forming the coating layer of the water-soluble photosensitive stencil material. The transparent material must be insoluble in water, and/or the aqueous solutions employed in the development and stripping steps, and in the color medium utilized. The transparent material may be a transparent colloid or a synthetic resin. Further, the transparent material may comprise a photopolymerized composition prepared from ethylenically unsaturated organic compounds, such as vinyl monomers, and a photoinitiator.

To form a multi-colored reproduction on the support medium 21, wherein different colors may be present in the same portion of the support medium 21, the process steps shown in FIGS. 2-5 are repeated at least once utilizing a different graphic object pattern and a different color medium. If desired, the intact color medium layer 25 may, prior to repeating the steps shown in FIGS. 2-5, be coated with a transparent material in which the intact color medium layer 25 is insoluble. Further, the transparent material itself is insoluble in water and/or the aqueous solutions employed in the development and stripping steps and also is insoluble in any additional color media which are to be applied.

Further, after the processes of FIGS. 2-5 have been carried out to form a color medium layer intact as a color image 25 on the defined areas 50, the steps shown in FIGS. 2-5 can be repeated utilizing the same graphic object patterns, a different color medium and a water-insoluble photosensitive stencil material rather than a water-soluble photosensitive material.

FIG. 8 represents a graphic object pattern photomask 26 in the form of a negative film transparency. The graphic object pattern 26 includes an opaque emulsion surface or mask defining a clear area represented by the character A.

FIG. 9 shows a support medium 28 of the same materials useful in the support medium 21 in FIG. 2. A coating layer 27 of a water-insoluble photosensitive stencil material is formed on the support medium 28.

The water-insoluble photosensitive stencil material 27 is of type B. Suitable type B materials include alkali-soluble resins which undergo a coupling reaction in an alkaline development solution, thereby rendering the unexposed areas insoluble in the alkaline solution, and sensitizers such as orthoquinone diazides or organoborate salts which are alkali-soluble after exposure, as described in De Forest, Photoresist Materials and Processes, Chapter 2, (McGraw-Hill, 1975). Aqueous type B photoresists may be used for photosensitive stencil material in the processes of the present invention without modification, since the flash exposure, described below in connection with FIG. 11, solubilizes the stencil for easy removal with water or an aqueous alkaline solution.

The graphic object pattern 26 in FIG. 9, is placed face-down on the coating layer 27 and the coating layer 27 is exposed to actinic radiation imagewise of the graphic object pattern to thereby photographically produce an imagewise pattern of water-insoluble and water-soluble stencil material regions on the support medium 28.

FIG. 10 represents the step of developing the imagewise pattern with water or an aqueous alkaline solution to remove the water-soluble stencil material regions of the imagewise pattern to thereby produce an image of the object pattern on the support medium 28, the image being of water-insoluble stencil material 29 and defining areas 80 having no stencil material on the support medium 28.

FIG. 11 represents the step of exposing the water-insoluble stencil material 29 to actinic rays 22 in an overall flash exposure, thus rendering the water-insoluble stencil material 29 soluble in water or aqueous alkaline solution.

FIG. 12 represents the step of coating the stencil material 29 and the defined areas 80 with a layer of water-permeable, water-insoluble medium 30 of a desired image color, as described in connection with FIG. 4.

FIG. 13 represents the step of removing or stripping the stencil material 29 and the overlying color medium layer 30 while leaving the color medium layer 30 intact as a color image 31 on the defined areas 80. The stripping solution, either water or an aqueous solution as described earlier, permeates the color medium 30 and removes the stencil material 29 and the color medium overlying the stencil material 29.

FIG. 14 shows an isometric view of the color image 31 reproduced from the film negative 26 of FIG. 8.

If a multi-colored reproduction is desired, it is necessary to prevent the solvents of the type B photosensitive stencil materials from redissolving the color medium images previously processed. Thus, the color images 31 are coated with a transparent protective layer prior to the application of another color. A suitable transparent material, coated from an aqueous solution, may be selected from one of the photopolymerizable compositions described in U.S. Pat. No. 3,101,270, in which the photopolymerized layer is resistant to most solvents.

To produce a multi-colored reproduction by the processes shown in FIGS. 9–13, wherein none of the different colored images is touching or overlapping, the processes shown in FIGS. 12 and 13 can be repeated in separate portions of the water-insoluble material 29.

Further, a multi-colored reproduction on the support medium 28, wherein different colors may be present in the same portion of the support medium, can be achieved by repeating the process steps shown in FIGS. 9–13 with different graphic object patterns and different media. Further, after the processes of FIGS. 9–13 have been carried out to form a color medium layer intact as a color image 31 on the defined areas 80 and the color image 31 has been coated by a transparent protective layer, the steps shown in FIGS. 9–13 can be repeated utilizing the same graphic object patterns, a different color medium and a water-soluble photosensitive stencil material in place of the water-insoluble stencil material.

FIG. 15 represents a graphic object pattern or photomask 36. Pattern 36 includes a clear transparent area defining an opaque emulsion surface or mask represented by the character A.

In FIG. 16, a first coating layer of a transparent lacquer 33, such as a synthetic resin lacquer, a photopolymerizable material or the like is formed on at least a portion of a support medium 32. A layer 34 of an organically-soluble color medium is then formed on the first coating layer 33 and dried. The color medium layer 34 is then treated with a substance such as talc to make the surface water receptive. A third coating layer 35 of a water-soluble photosensitive stencil material of type A is then formed on the second coating layer 34. The graphic object pattern 36 is placed face-down on the third coating layer 35 and rays of actinic light 37 pass through the transparent portion of object pattern 36 and into third coating layer 35 to thereby photographically produce an imagewise pattern of water-insoluble and water-soluble stencil material regions on the second coating layer 34.

As shown in FIG. 17, the unexposed water-soluble stencil material regions are then washed out using water or an aqueous solution to produce an image 58 of the object pattern on the second coating layer 34, the image 58 being of water-insoluble stencil material and defining areas 60 having no stencil material on the second coating layer 34.

FIG. 18 demonstrates the step of removing the first and second coating layers 33 and 34 in the defined areas 60 to expose the support medium 32 in the defined areas 60.

FIG. 19 shows forming on the defined areas 60 and on the image 58 a fourth coating layer 38 of a water-permeable, water-insoluble color medium differing in color from that of second coating layer 34.

FIG. 20 represents the step of removing or stripping the image 58 and the color medium layer 38 overlying the image 58, while leaving intact the fourth coating layer 38 on the defined areas 60 of the support medium 32 and while also leaving intact the second coating layer 34 of color medium underlying the water-insoluble stencil material image 58.

FIG. 21 shows an isometric view of the two color design produced with single exposure through a single photomask with automatic register of color image 34 to color image 38.

FIG. 22 shows a graphic object pattern or photomask 42. The pattern 42 includes a clear area defining an opaque emulsion surface or mask represented by the character A.

In FIG. 23, a first coating layer of transparent lacquer 40, such as that described above, is formed on at least a portion of a support medium 39. A second coating layer 41 of water-soluble photosensitive stencil material of type A is then formed on the first coating layer 40. The graphic object pattern is then placed face-down on the second coating layer 41 and actinic rays 60 pass through the transparent portions of graphic object pattern 42 and expose the second coating layer 41 to photographically produce an imagewise pattern of water-insoluble and water-soluble stencil material regions on the first coating layer 40.

FIG. 24 shows the step of developing the imagewise pattern with water or an aqueous solution to remove the water-soluble stencil material in the second coating layer 41 to thereby produce an image 62 of the object pattern on the first coating layer 40, the image 62 being of water-insoluble stencil material and defining areas 64 having no stencil material on the first coating layer 40.

FIG. 25 shows formation of a third coating layer 43 comprising a water-insoluble, water-permeable organic dye solution without a binder resin but containing a solvent for the first coating layer 40 on the defined areas 64 of the first layer 40 and on the image 62. In the areas 64, the organic dye dissolves the lacquer which thereby forms a binder for the dye solution 44 in the areas 64, as shown in FIG. 26.

FIG. 27 represents the step of removing or stripping the image 62 along with the overlying dye 43, while leaving the dye solution bound by dissolved lacquer 44 on the portions of the support 39 underlying the defined areas 64.

FIG. 28 shows an isometric view of the color image 44, reproduced from the graphic object pattern of FIG. 22. In the portion of the process represented in FIG. 25, the dye 43 can be substituted by a water-insoluble, water-permeable aqueous dispersion of a pigment without a binder resin but containing a solvent for the first coating layer 40.

FIG. 29 shows a graphic object pattern 47. The pattern 47 includes a clear area defining an opaque emulsion surface or mask represented by the character A.

In FIG. 30, a transparent or aluminum foil support medium 45 is coated with a first layer 46 of water-soluble photosensitive stencil material containing an opaque metal oxide pigment catalyst and an organic dye promoter. The graphic object pattern is placed face-down on the first coating layer 46 and the first coating layer 46 is exposed imagewise to actinic radiation 66 through the transparent portions of graphic object pattern 47 to photographically produce an imagewise pattern of water-insoluble and water-soluble stencil material regions 70 and 68, respectively, on the support medium 45. A second coating layer of water-permeable, water-insoluble dye solution 48 is then formed on the first coating layer 46 and dried, as shown in FIG. 31.

FIG. 32 shows the step of removing or stripping the second coating layer 48 with water or an aqueous solution to remove the underlying water-soluble stencil material regions 68 and the overlying second layer 48, while leaving the second coating layer 48 intact over the underlying water-insoluble stencil material regions 70. FIG. 33 shows an isometric view of the opaque image produced.

In the photosensitive material layer 46, the opaque pigment may be titanium dioxide and the organic promoter may be an organic dye.

The following examples illustrate the invention but are not limitations thereon.

EXAMPLE I

A white plastic support sheet known by the brand name "Kimdura," manufactured by the Kimberly-Clark Company, was coated with a photostencil material consisting of a dichromated polyvinyl alcohol:polyvinyl pyrrolidone (50:50) aqueous solution, and then dried. This layer was then exposed to actinic light through a positive transparency, rendering the light-exposed areas insoluble in water thereafter. The layer was then developed by washing out the soluble material with water and the surface dried. A layer of alcohol-soluble nitrocellulose ink containing a pigment colorant was then coated overall and dried. The surface was then spray washed with water and swabbed with a cotton pad, removing the photostencil and overlying ink, leaving a colored ink image on the support.

EXAMPLE II

A sheet of aqueous alkali-developable dry-film composite layer photoresist, known by the brand name Riston and manufactured by Du Pont, was heat laminated to a clear polyester film sheet and exposed to actinic light through a negative transparency. The thin mylar protective sheet adhering to the photosensitive layer of the Riston composite layer was then removed and the exposed areas washed out with a spray of aqueous alkali developer which neutralizes the carboxylic acid groups to form water-soluble salts which are dissolved in the developer. The developed stencil was then spray rinsed in plain water and dried. Then, before the water-permeable but water-insoluble ink was coated overall, the stencil was given an overall flash exposure to actinic light, thereby rendering it water-soluble. A layer of an alcohol soluble ethyl cellulose ink containing a pigment colorant was coated overall and dried. The surface was then sprayed with the alkali developer and swabbed with a cotton pad, removing the photostencil and overlying ink. After spraying with plain water and drying, a colored ink image was left on the support.

EXAMPLE III

This example will illustrate the procedures required to produce a two-color design in which colored copy appears on a background of a different color. A photomask was made from an original black and white drawing. A support sheet of "Kimdura" was coated with a layer of synthetic resin lacquer, such as "Saran F-310" (Dow Chemical Company), and dried. A layer of resoluble ink, such as nitrocellulose ink, was coated and dried. The layer of ink was then powdered with talc and rubbed, making the surface water-receptive. A photoresist material, such as a chromated colloid, was then coated over the ink and dried. The sheet was then exposed to the photomask, the photoresist washed out in the unexposed areas with water and dried. The ink and the underlying lacquer were then removed in the same unexposed areas where the unexposed resist had just been removed, by an application of a ketone solvent, which is a solvent for both the ink and lacquer. The resulting composite image consists of a lacquer, ink and resist layer. Up to this point, the procedure is similar to that of my prior invention as disclosed in U.S. Pat. No. 3,258,337. Next, the ink of the second required color was coated overall and dried. The sheet was then washed with a water spray and swabbed with a cotton pad, removing both the second ink and hardened resist overlying the image of the first color. A two-color design was thus produced with a single exposure through a single photomask, with automatic register of the first color image to the second color image.

EXAMPLE IV

This example will illustrate the procedures required to produce a color image on a support by means of a dye solution used in place of an ink and without the addition of a binder resin. A nitrocellulose clear lacquer was coated on a sheet of Kimdura and dried. A Type A photostencil material was then coated and dried, exposed to a photomask, developed and dried again. An organic dye solution, containing a solvent for the lacquer coating, is coated overall and dried. The application of the dye solution dissolves the lacquer coating which then becomes a binder for the dye. The photostencil and overlying dye are then removed with a water wash and cotton swabbing.

EXAMPLE V

This is a variation of Example IV, using an aqueous dispersion of a pigment, such as the brand "Aurasperse," (Harshaw Chemical Company), in place of the dye solution. The procedure is: coat lacquer; coat Type A photostencil; expose to photomask and develop; coat "Aurasperse" coating overall. Apply a solvent for the lacquer which, while in solution, wets the pigment layer and thereby becomes a binder for the pigment. Then the photostencil and overlying pigment are removed with a water wash and cotton swabbing.

In both examples IV and V, the color medium is not an ink as applied, but ends up as such in the finished image. Such a system facilitates the removal of the photostencil with water, since the color medium overlying said photostencil has no binder requiring permeation by water.

EXAMPLE VI

This example will illustrate the procedures required to produce opaque images on such supports as transparent plastic films, aluminum foil and the like, where the hiding power of opaque pigments such as titanium dioxide is required. A transparent sheet of polyester plastic, brand name "Mylar" (DuPont's brand), was coated with a photostencil material containing one or more water-soluble photopolymerizable monomers, titanium dioxide as a catalyst, and an organic dye as a promoter, and dried. Exposure to actinic light was made through a photomask and the layer then coated with a dye solution and dried. The layer was then washed with a spray of water, redissolving the unexposed areas of the photostencil along with the adsorbed dye, leaving an opaque image of titanium dioxide dyed with the dye color.

I claim:

1. A method for directly forming a color reproduction of a graphic object pattern on a support medium, comprising the steps of:
   (a) forming a coating layer of water-soluble photosensitive stencil material on at least a portion of said support medium, said water-soluble photosensitive stencil material being rendered water-insoluble by actinic radiation;
   (b) single exposing said coating layer to actinic radiation imagewise of a graphic object pattern to thereby photographically produce an imagewise pattern of water-insoluble and water-soluble stencil material regions on said support medium;
   (c) developing said imagewise pattern with water or an aqueous alkaline solution to remove the water-soluble stencil material regions of said imagewise pattern to thereby form a stencil image of said object pattern on said support medium, said image being of water-insoluble stencil material and defining areas having no stencil material on said support medium;
   (d) overcoating with a layer of a water-permeable, water-insoluble color medium selected from the group consisting of inks, paints and dyestuff solutions of a desired image color at least a portion of said water-insoluble stencil material image and of said defined areas having no stencil material;
   (e) treating the overcoated portion of said water-insoluble stencil material with water or an aqueous alkaline solution to permeate the color medium and soften the water-insoluble stencil material; and
   (f) removing by mechanical action said softened water-insoluble stencil material along with the color medium layer overlying it, while leaving said color medium layer intact as a color image on said defined areas, whereby a color reproduction of said graphic object pattern is directly formed on said support medium.

2. The method of claim 1, further including repeating at least once step (d) with a layer of water-permeable, water-insoluble color medium of a different image color on another portion of said water-insoluble material and of said defined areas, followed by steps (e) and (f) to form a multicolored reproduction of said graphic object pattern on said support medium.

3. The method of claim 1, further including the step of coating a transparent material over said support medium prior to step a), said transparent material being insoluble in said water, said aqueous alkaline solution and said color medium overcoating.

4. The method of claim 1, further including the step of: (g), repeating at least once steps (a) through (f) utilizing a different graphic object pattern and a different color medium to form a multicolored reproduction on said support medium.

5. The method of claim 4, further including, immediately prior to step (g), the step of:
   overcoating said intact color medium layer with a transparent material in which said intact color medium is insoluble and which itself is insoluble in said water, said aqueous alkaline solution and said different color medium.

6. The method of claim 1, further including the step of:
   (g) repeating steps (a) through (f) utilizing a different color medium and wherein the coating layer in repeated step (a) is of a water-insoluble photosensitive material.

7. The process of claim 1, wherein said photosensitive stencil material is colored.

8. The process of claim 1, wherein said color medium is an ink comprised at least of a pigment colorant and a polar resin dissolved in a solvent selected from the group consisting of polar solvents, hydrogen-bonded solvents and mixtures thereof.

9. The process of claim 8, wherein said polar resin is a cellulosic resin containing free hydroxyl groups in the cellulose chain.

10. The process of claim 1, wherein the aqueous solution contains a surfactant.

11. The process of claim 1, wherein said water-soluble photosensitive stencil material is comprised of a photoresist composition modified by the addition of non-photosensitive cellulose derivatives to reduce the insolubilization of the stencil material exposed to said actinic radiation.

12. The method of claim 1, wherein said stencil material is a positive-working photoresist.

13. The method of claim 12 wherein said positive-working photoresist is modified by the addition of at least one dyestuff selected from the group consisting of amino fluorines, hydroxy fluorines and hydroxy fluorones.

14. The method of claim 12, wherein said positive-working photoresist is modified by the addition of at least one compound to reduce the resistance to removal in the stripping step of the stencil material exposed to said actinic radiation.

15. The method of claim 1, wherein said color medium is an emulsion paint containing at least a dye, a metal oxide pigment and a polymer dispersed in water.

16. The method of claim 1, wherein said photosensitive material is Type A.

17. A method for directly forming a color reproduction of a graphic object pattern on a support medium comprising the steps of:
   (a) forming a coating layer of a water-insoluble photosensitive stencil material on at least a portion of said support medium, said water-insoluble photosensitive stencil material being rendered water-soluble by actinic radiation;

(b) single exposing said coating layer to actinic radiation imagewise of a graphic object pattern to thereby photographically produce an imagewise pattern of water-insoluble and water-soluble stencil material regions on said support medium;

(c) developing said imagewise pattern with water or an aqueous alkaline solution to remove the water-soluble stencil material regions of said imagewise pattern to thereby form a stencil image of said object pattern on said support medium, said image being of water-insoluble stencil material and defining areas having no stencil material on said support medium;

(d) exposing said remaining water-insoluble stencil material to sufficient light to render said remaining stencil material soluble in water or an aqueous solution;

(e) overcoating with a layer of water-permeable, water-insoluble color medium selected from the group consisting of inks, paints and dyestuff solutions of a desired image color at least a portion of said water-soluble stencil material image and of said defined areas having no stencil material; and (f) treating at least the overcoated portion of said now water-soluble stencil material with water or an aqueous alkaline solution to permeate said color medium and remove said stencil material and the overlying color medium layer, while leaving the color medium layer intact as a color image on said defined areas, whereby a color reproduction of said graphic object pattern is directly formed on said support medium.

18. The method of claim 17, further including repeating at least once step (e) with a layer of water-permeable, water-insoluble color medium of a different image color on another portion of said water-soluble stencil material and of said defined areas, followed by step (f), to produce a multicolored reproduction of said graphic object pattern on said support medium.

19. The method of claim 17, further including the step of coating a transparent material over said support medium prior to step (a), said material being insoluble in said water, said aqueous alkaline solution and said color medium overcoating.

20. The method of claim 17, further including the steps of:

(g) overcoating said intact color medium layer with a transparent material which is insoluble in said water, said aqueous alkaline solution and said color medium and in which said intact color medium is insoluble; and (h) repeating steps (a) through (f) utilizing at least one different graphic object pattern and a different color medium to obtain a multicolored reproduction.

21. The method of claim 17, further including the step of:

(g) repeating steps (a) through (f) utilizing a different color medium and wherein the coating layer in repeated step (a) is of a water-soluble photosensitive material.

22. The process of claim 17, wherein said photosensitive stencil material is colored.

23. The process of claim 17, wherein said color medium is an ink comprised of a pigment colorant and a polar resin dissolved in a polar solvent.

24. The process of claim 23, wherein said polar resin is a cellulosic resin containing free hydroxyl groups in the cellulose chain.

25. The process of claim 17, wherein said aqueous solution contains a surfactant.

26. The process of claim 17, wherein said photosensitive material is Type B.

27. A method of directly forming a multicolor reproduction of a graphic object pattern on a support medium comprising the steps of:

(a) forming a first coating layer of a transparent lacquer on at least a portion of said support medium;

(b) forming a second coating layer of an organically-soluble color medium on said first coating layer;

(c) applying a substance to said second coating layer to give said second coating layer a water-receptive surface;

(d) forming a third coating layer of a water-soluble photosensitive stencil material on said second coating layer;

(e) single exposing said third coating layer to actinic light imagewise of a graphic object pattern to thereby photographically produce an imagewise pattern of water-insoluble and water-soluble stencil material regions on said second coating layer;

(f) developing said imagewise pattern with water or an aqueous alkaline solution to remove the water-soluble stencil material regions in said third coating layer to thereby form a stencil image of said object pattern on said second coating layer, said image being of water-insoluble stencil material and defining areas having no stencil material on said second coating layer;

(g) removing with an organic solvent said first and second coating layers in the defined areas to expose said support medium in said areas;

(h) forming on said defined areas of said support medium and on said image produced in step (f) a fourth coating layer of a water-permeable, water-insoluble color medium differing in color from that applied in step (b);

(i) treating said fourth coating layer of color medium with water or an aqueous alkaline solution which permeates the color medium and softens the water-insoluble stencil material; and (j) removing by mechanical action said softened water-insoluble stencil material along with the color medium layer overlying it, while leaving intact said fourth coating layer of color medium on said defined areas of said support medium and while leaving intact said second coating layer of medium underlying said image;

whereby a multicolor reproduction is directly formed on said support medium.

28. A method for producing a color image on a support medium comprising the steps of:

(a) forming a first coating layer of transparent lacquer on at least a portion of a support medium;

(b) forming a second coating layer of water-soluble photosensitive stencil material on said first coating layer;

(c) single exposing said second coating layer to actinic radiation imagewise of a graphic object pattern to thereby photographically produce an imagewise pattern of water-insoluble and water-soluble stencil material regions on said first coating layer;

(d) developing said imagewise pattern with water or an aqueous alkaline solution to remove the water-soluble stencil material in said second coating layer to thereby form a stencil image of said object pattern on said first coating layer, said image being of water-insoluble stencil material and defining areas having no stencil material on said first coating layer;

(e) forming on said defined areas of said first layer and said image produced in step f), a third coating layer comprising a water-insoluble, water-permeable organic dye solution without a binder resin but containing a solvent for said first coating layer, whereby said first layer in said defined areas is dissolved by said dye solution and forms a binder for said dye solution in said areas;

(f) treating said third coating layer of color medium with water or an aqueous alkaline solution which permeates the color medium and softens the water-insoluble stencil material; and (g) removing by mechanical action said water-insoluble stencil material along with the organic dye solution overlying it, while leaving said third coating layer of color medium intact on the portion of the support underlying said defined areas of said first layer, whereby a color image of said graphic object pattern is formed on said support medium.

29. The method of claim 28, wherein said third coating layer comprises a water-insoluble, water-permeable aqueous dispersion of a pigment without a binder resin but containing a solvent for said first coating layer, whereby said first layer in said defined areas is dissolved by said aqueous dispersion of a pigment and forms a binder for said pigment in said areas and wherein said mechanical action removes said water-insoluble stencil material along with said pigment overlying it, while leaving said third coating layer of color medium intact on said defined areas of said first layer.

30. A method for producing an opaque image on a support medium requiring the hiding power of an opaque pigment comprising the steps of:

(a) forming a first coating layer of water-soluble photosensitive stencil material containing an opaque metal oxide pigment catalyst and an organic dye promoter on at least a portion of a support medium;

(b) single exposing said first coating layer to actinic radiation imagewise of a graphic object pattern to thereby photographically produce an imagewise pattern of water-insoluble and water-soluble stencil material regions on said support medium;

(c) forming a second coating layer of a water-permeable, water-insoluble dye solution on said first coating layer;

(d) drying said second coating layer;

(e) treating said second coating layer with water or an aqueous alkaline solution to permeate said second layer and remove said underlying water-soluble stencil material regions and the overlying second layer, while leaving the second coating layer intact over said underlying water-insoluble stencil material regions.

31. The method of claim 30 wherein said opaque pigment is titanium dioxide and said organic promoter is an organic dye.

* * * * *